United States Patent [19]

Purdom

[11] Patent Number: 5,756,934

[45] Date of Patent: May 26, 1998

[54] FLIGHT CRASH SURVIVABLE STORAGE UNIT WITH AQUARIUM CONTAINER FOR FLIGHT RECORDER MEMORY

[75] Inventor: Gregory W. Purdom, Sarasota, Fla.

[73] Assignee: Loral Fairchild Corp.

[21] Appl. No.: 320,265

[22] Filed: Oct. 11, 1994

[51] Int. Cl.[6] .................................................. H05K 5/00
[52] U.S. Cl. ................................. 174/52.1; 174/52.2
[58] Field of Search .............................. 174/52.1, 52.2; 206/501, 502, 408; 200/4.02, 453, 468; 29/248

[56] References Cited

U.S. PATENT DOCUMENTS

| | | | |
|---|---|---|---|
| 4,694,119 | 9/1987 | Groenewegen | 174/52.2 |
| 5,123,538 | 6/1992 | Groenewegen | 206/521 |
| 5,193,046 | 3/1993 | Lemke et al. | 360/97.02 |
| 5,370,814 | 12/1994 | Salyer | 252/70 |
| 5,452,685 | 9/1995 | Thomas | 119/850 |

*Primary Examiner*—Kristine L. Kincaid
*Assistant Examiner*—Kristina Soderquist
*Attorney, Agent, or Firm*—Joseph J. Kaliko

[57] ABSTRACT

An enclosure for protecting a heat sensitive item from high temperatures and shock which includes: (a) an outer housing including an inner cavity for containing at least one heat sensitive item; (b) an aquarium located within the inner cavity including at least one protective compartment within which the at least one heat sensitive item is located; (c) a thermal mass, located within the inner cavity and covering at least a portion of the exterior surface of the aquarium; and (d) a venting mechanism for venting any moisture, that penetrates the aquarium and enters the at least one protective compartment included therein, to the ambient air outside the outer housing. The invention finds particular utility in the Flight Recorder field where heat sensitive components, such as solid state memories, may be subject to fire and shock often resulting from an aircraft crash. The invention also features a corrosion protection capability which is effective when the item being protected is in close proximity to a source of moisture. Further aspects of the invention are directed to processes for fabricating enclosures of then type contemplated by the invention (a Flight Crash Survival Storage Unit (FCSSU) in the Flight Recorder context), and to an aquarium per se for use in a FCSSU of the type contemplated by the invention.

60 Claims, 3 Drawing Sheets

FLIGHT CRASH SURVIVABLE STORAGE UNIT WITH AQUARIUM CONTAINER FOR FLIGHT RECORDER MEMORY

BACKGROUND OF THE INVENTION

1. Field of the Invention

The invention relates generally to methods and apparatus for protecting heat sensitive items, such as solid state memory devices used in a Flight Recorder (FR), from high temperature environments occurring, for example, if a fire should result following an aircraft crash. The invention also relates generally to methods and apparatus for protecting such items from shock damage and the effects of moisture. This is particularly important when the heat sensitive item is an electronic component like the aforementioned solid state memory device.

More particularly, the invention relates to heat shielded enclosures (such as a commercially available Flight Crash Survivable Storage Unit (FCSSU) used in FRs), and processes for fabricating such enclosures, for protecting and preserving a given device or assembly from moisture, shock damage and otherwise destructive high temperatures.

The invention specifically relates to heat shielded enclosures wherein enclosure size and weight is an important consideration. Once again, an example of where such considerations are important is in the on board aircraft FR context.

In the disclosed embodiment of the invention, used to illustrate the principals thereof, a compact, lightweight FCSSU, including a solid state memory unit, is described. The FCSSU is fabricated, in accordance with the teachings of the invention, to incorporate an "aquarium". An aquarium is defined herein to mean a containment structure which is used to separate thermal mass moisture from the devices (e.g., electronics), being protected.

According to one embodiment of the invention, the aquarium is a sealed unit used to contain a device being protected (such as solid state memory device) in at least one protective compartment, where the sealed unit is operative to separate a thermal mass (e.g., water), located on the exterior of the sealed unit, from the device inside and thereby minimize the transfer of moisture between the thermal mass and the device contained in the at least one protective compartment.

The aquarium, according to a preferred embodiment of the invention, is located within an inner cavity formed by an outer housing designed to receive and protect it. The aforementioned thermal mass is also located within the inner cavity and covers at least a portion of the exterior surface of the aquarium.

The invention further contemplates the use of a means for venting any moisture that enters the at least one protective compartment to the ambient air outside said outer housing.

The FCSSU incorporating the aforementioned aquarium design, which will be explained in greater detail hereinafter, protects the memory from (a) thermal mass moisture contamination over time; (b) the shock associated with an aircraft crash and (c) the heat associated with an ensuing fire, with little or no loss of stored information.

2. Description of the Related Art

Although there are numerous situations in which it is necessary or desirable to protect an item, device or assembly from deleterious exposure to a high temperature environment, shielding the memory device of an aircraft FR system during crash and a fire presents extremely demanding design constraints.

In this regard, in order to preserve flight information supplied to the memory unit by the flight information recorder data acquisition unit during a predetermined time interval immediately prior to an aircraft crash, the memory unit must be configured and arranged to withstand temperatures in excess of 1100° C. (approximately 2000° F.), experienced during a fire while simultaneously being constructed to endure crushing and penetration forces experienced either on impact or during secondary impact with other portions or pieces of the aircraft. Further, the memory unit of a FR system is subject to additional design constraints imposed by considerations generally applicable to aircraft equipment and systems, including constraints relating to size, weight, cost, serviceability and reliability. For example, protecting the memory unit from the deleterious effects of moisture, particularly when the memory is an electronic device, impacts the aforementioned reliability constraint.

Technical advances in the various electronic solid state device arts have led to high capacity electronic memory devices for nonvolatile storage of digitally encoded information with programmable read only field effect transistor devices and bubble memory devices being two types of such memories. Because such devices are small and lightweight and exhibit high reliability, there has been substantial impetus for replacing the magnetic tape transports utilized in older flight recorder system designs with solid state memories.

Because of increasing heat shielding demands, it is desirable to improve upon currently employed device protection techniques such as those involving the (a) mounting a tape transport, or other flight voice or data recorder memory device, within a cavity that is formed by encasing the memory device with a solid material that is a relatively good thermal insulator; and (b) surrounding that assemblage with a protective metal housing. Such techniques do not achieve the desired overall objectives of reduction in memory unit size and weight that might be obtained in flight recorder systems employing semiconductor memory devices such as erasable programmable read only memories; while at the same time providing enhanced protection for such devices against the effects of heat, shock and moisture.

To illustrate the state of the art, reference should be made to (a) U.S. Pat. No. 4,694,119, to Groenewegen, entitled "Heat Shielded Memory Unit For An Aircraft Flight Data Recorder", issued Sep. 15, 1987; (2) U.S. Pat. No. 4,944,401, to Groenewegen, entitled "Crash Survivable Enclosure For Flight Recorder", issued Jul. 31, 1990; and (3) commercially available solid state FR systems, such as the Model A100AS Solid State Cockpit Voice Recorder (SSCVR) system presently manufactured and sold by Loral Data Systems of Sarasota Fla.

The technique for protecting the solid state memory devices incorporated in the Flight Data Recorder described in the illustrative U.S. Pat. No. 4,694,119 involves the use of a thermal liner, which is a solid synthetic organic wax, to encapsulate the memory devices. This reference teaches the utilization of heat of fusion (the melting wax) to protect the memory devices. It does not utilize the more efficient technique of utilizing vaporization to keep the memory cool or deal with the problem of protecting the memory from the moisture content of thermal masses stored in the FR.

The technique for protecting the solid state memory device incorporated in the FR described in the illustrative U.S. Pat. No. 4,944,401 patent, involves the use of a wax filler in an inner shell. The wax filler acts to support the memory device and further acts as a phase change material (PCM) with a high melting temperature and a high heat of fusion, to perform the function of a heat sink. The inner shell is supported, and the memory enclosed therein further protected against fire and shock, by a closed cell foam thermal liner. This reference, like the U.S. Pat. No. 4,694,119, teaches the utilization of heat of fusion to protect the memory device.

The exemplary Model A100AS Solid State Cockpit Voice Recorder (SSCVR) illustrates the state of the art concept of enclosing a memory module in a water/silica dry powder (a PCM), which has a high latent heat of vaporization and acts as a heat sink for absorbing large quantities of heat following an aircraft crash. The water essentially forms an even but thin coating over the vast surface area of the silica. After the water is evaporated, the remaining silica becomes a good thermal insulator because of its low coefficient of thermal conductivity. The small size and spherical shape of the silica particles allows the absorbs water to freeze and thaw without an apparent density change which could damage the memory device. The water/silica dry powder is also used to cushion the memory modules during an airplane crash.

The Model A100AS also employs a low density closed cell foam which is used to encapsulate the memory device to prevent damage due to shock and vibration. Furthermore, a light weight metal outer enclosure (the outer shell of the FCSSU) is used to protect against crash impact and penetration forces which may occur during an aircraft crash.

The techniques used in the Model A100AS and similar techniques which surround encapsulated chips with a PCM material, are subject to the corrosion effects of the moisture content of the PCM.

In view of the state of the art as illustrated hereinabove and the objective of improving memory device protection capabilities in the illustrative FR applications (where safety and performance requirements are increasing), it is desirable to provide methods and apparatus for improving the fire, shock and moisture protection performance of FCSSUs.

It is also desirable to more generally provide methods and apparatus for protecting heat sensitive items from high temperatures, shock and the effects of moisture, independent of the end use of the device that includes the heat sensitive item.

Furthermore, it is desirable to provide methods and apparatus for protecting heat sensitive items from high temperatures, shock and the effects of moisture utilizing protection devices which satisfy the size, weight, cost, strength, serviceability and reliability constraints mentioned hereinbefore, particularly in the context of memory devices used in FR applications.

Still further, particularly in the FR context, it is desirable to provide methods and apparatus for memory device protection which separate thermal mass moisture from the memory device (particularly electronic type devices), to minimize the potential for device corrosion.

Further yet, it is desirable to provide an FCSSU which uses the efficient process of the latent heat of vaporization as the cooling mechanism to reduce the amount of thermal mass required in the FCSSU; and an FCSSU which includes means for removing any moisture entering the compartment where the device or devices being protected are stored.

It is further desirable to provide processes for fabricating heat sensitive device enclosures that incorporate the features for such enclosures referred to hereinabove.

SUMMARY OF THE INVENTION

Accordingly, it is a general object of the invention to provide methods and apparatus for protecting heat sensitive items from high temperatures, shock and the effects of moisture, independent of the end use of the device that includes the heat sensitive item.

It is a further general object of the invention to provide methods and apparatus for protecting heat sensitive items from high temperatures, shock and the effects of moisture utilizing protection devices which satisfy the size, weight, cost, strength, serviceability and reliability constraints mentioned hereinbefore, particularly in the context of memory devices used in FR applications.

A still further general object of the invention is to provide methods and apparatus for heat sensitive item protection which make effective use of any thermal mass used to protect the device and which minimizes the quantity (weight and volume) of the thermal mass required to perform its cooling function.

A specific object of the invention is to improve memory device protection capabilities in FR applications. In particular it is an object of the invention to provide methods and apparatus for improving the fire, shock and moisture protection performance of FCSSUs in particular and FRs in general.

A further specific object of the invention in the FR context is to separate thermal mass moisture from the memory device (particularly electronic type devices).

Further yet, it is an object of the invention to provide an FCSSU which uses the efficient process of the latent heat of vaporization as the cooling mechanism to reduce the amount of thermal mass required in the FCSSU; and an FCSSU which includes means for removing any moisture entering the compartment where the device or devices being protected are stored.

Yet another object of the invention is to provide processes for fabricating heat sensitive device enclosures that incorporate the desirable features for such enclosures referred to hereinabove.

According to the invention, which will be described for illustrative purposes only in the context of a novel FCSSU used in a FR (it being understood that the invention is intended to be broad enough in scope to cover other device protection applications as well and be limited only by the scope of the appended claims), the FCSSU employs an "aquarium" design, defined hereinbefore to mean a containment structure which is used to separate thermal mass moisture from the devices (e.g., electronics), being protected. Additionally, the invention contemplates the use of a means for venting any moisture that enters the aquarium to the ambient air outside said outer housing.

The disclosed FCSSU incorporating the aquarium design concept protects the memory unit from the long term effects of moisture, such as shorts and opens resulting from corrosion while the FR is in normal service.

Other FCSSU components and design concepts incorporated in preferred embodiments of the invention, such as the use of thermal masses that protect the aquarium from shock damage as well as heat, cable routing preferences to prevent excess heat entering the aquarium via the cable coupled between the devices being protected and FR components located outside the FCSSU, etc., are disclosed.

Additionally, a novel FR/FCSSU aquarium per se is described along with illustrative processes for fabricating an FCSSU that includes the preferred aquarium structure.

According to one specific embodiment of the invention a corrosion resistant enclosure for thermally protecting at least one-heat sensitive item from high temperatures, shock and moisture, comprises: (a) an outer housing including an inner cavity for containing at least one heat sensitive item; (b) an aquarium located within the inner cavity including at least one protective compartment within which the at least one heat sensitive item is located; (c) a thermal mass, located within the inner cavity and covering at least a portion of the exterior surface of the aquarium; and (d) means for venting any moisture, that penetrates the aquarium and enters the at least one protective compartment included therein, to the ambient air outside the outer housing.

According to a preferred embodiment of the invention, means are also provided for venting steam from the aforementioned inner cavity to the ambient air outside the outer housing, with the means for venting steam functioning to maintain the pressure and temperature within the inner cavity within a predefined range.

An alternate embodiment of the invention is directed to a flight recorder (e.g., a cockpit voice recorder or flight data recorder), comprising: (a) at least one solid state memory device; (b) a corrosion resistant Flight Crash Survivable Storage Unit (FCSSU) that contains and protects the at least one solid state memory device from shock and fire, wherein the FCSSU includes: (b1) an outer housing including an inner cavity for containing at least one heat sensitive item; (b2) an aquarium located within the inner cavity including at least one protective compartment within which the at least one heat sensitive item is located; (b3) a thermal mass, located within the inner cavity and covering at least a portion of the exterior surface of the aquarium; and (b4) means for venting any moisture that penetrates the aquarium, and enters the at least one protective compartment included therein, to the ambient air outside the outer housing; and (c) means for venting steam from the inner cavity to the ambient air outside the outer housing.

According to a preferred embodiment of the invention, the means for venting any moisture further comprises a ribbon cable electrically coupled to the at least one heat sensitive item, wherein the ribbon cable exits the at least one protective compartment and extends to and thru an enclosure formed by the combination of a cover and the outer housing, and further wherein the ribbon cable has at least one vent tube integrally formed therein for venting the moisture.

Yet another aspect of the invention is directed to a process for fabricating a Flight Crash Survivable Storage Unit (FCSSU) for a Flight Recorder (FR) comprising the steps of: (a) fabricating an aquarium that includes at least one heat sensitive item, to be protected from heat, moisture and shock, installed in at least one protective compartment; (b) installing the aquarium within an outer housing that includes a thermal mass covering at least a portion of the exterior surface of the aquarium; and (c) fabricating means for venting moisture penetrating the aquarium and entering the at least one protective compartment included therein, to the ambient air outside the outer housing.

According to a preferred process for fabricating an FCSSU of the type contemplated by the invention, a steam vent is fabricated as part of the outer housing (or as part of a cover therefore). The steam vent is preferably sized to allow steam to escape from within the outer housing (or more precisely, a sealed enclosure formed by the outer housing and a cover therefore), while maintaining the pressure and temperature therein within a predefined range.

The aforementioned preferred process also contemplates the steps of providing an electrical connection to said at least one heat sensitive item via a cable which exits said at least one protective compartment and the aquarium; utilizing clear acrylic to form aquarium walls; chemically welding the clear acrylic with a chemical solvent to inhibit moisture from penetrating the aquarium structure; sealing the cable exit from the aquarium to further prevent moisture transfer; and separating the cable from the aquarium as the cable runs from the aquarium to and through an enclosure containing the thermal mass, etc., to minimize heat transfer between the cable and the aquarium.

A preferred process for fabricating an FCSSU contemplated by the invention also includes the step of integrating the means for venting moisture with said cable.

A still further aspect of the invention is directed to an aquarium per se for a protecting (from heat, shock and moisture) a memory device included in a Flight Recorder (FR), comprising: (a) a moisture resistant enclosure for containing the memory device to be protected; and (b) means for venting moisture from the enclosure.

According to a preferred embodiment of the invention, the aquarium also includes a cable, for providing electrical connection to the memory device, which exits the moisture resistant enclosure via a sealed opening in the enclosure; and means for venting moisture integrated into the cable.

The invention features improved heat sensitive item protection capabilities, particularly improved fire protection performance for FRs that include solid state memories. The invention also features corrosion and shock damage protection capabilities; and satisfaction of the aforementioned size, weight, cost, strength, serviceability and reliability constraints, particularly in the FR applications described hereinbefore.

These and other objects, embodiments and features of the present invention and the manner of obtaining them will become apparent to those skilled in the art, and the invention itself will be best understood by reference to the following Detailed Description read in conjunction with the accompanying Drawing.

DETAILED DESCRIPTION

Figure 1A:
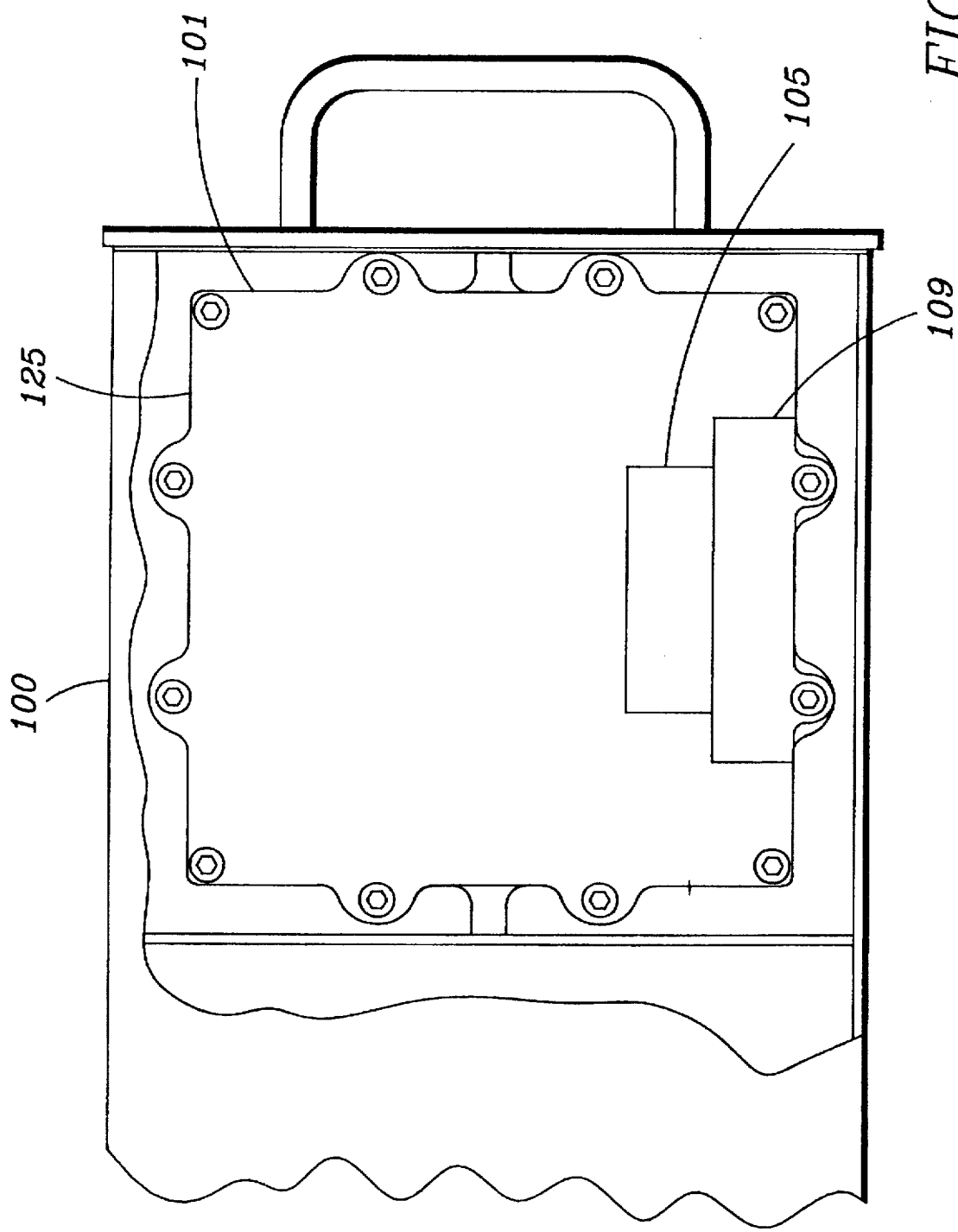
FIG. 1A is a top view of an illustrative Flight Crash Survivable Storage Unit (FCSSU) located in exemplary Flight Recorder.
Figure 1B:
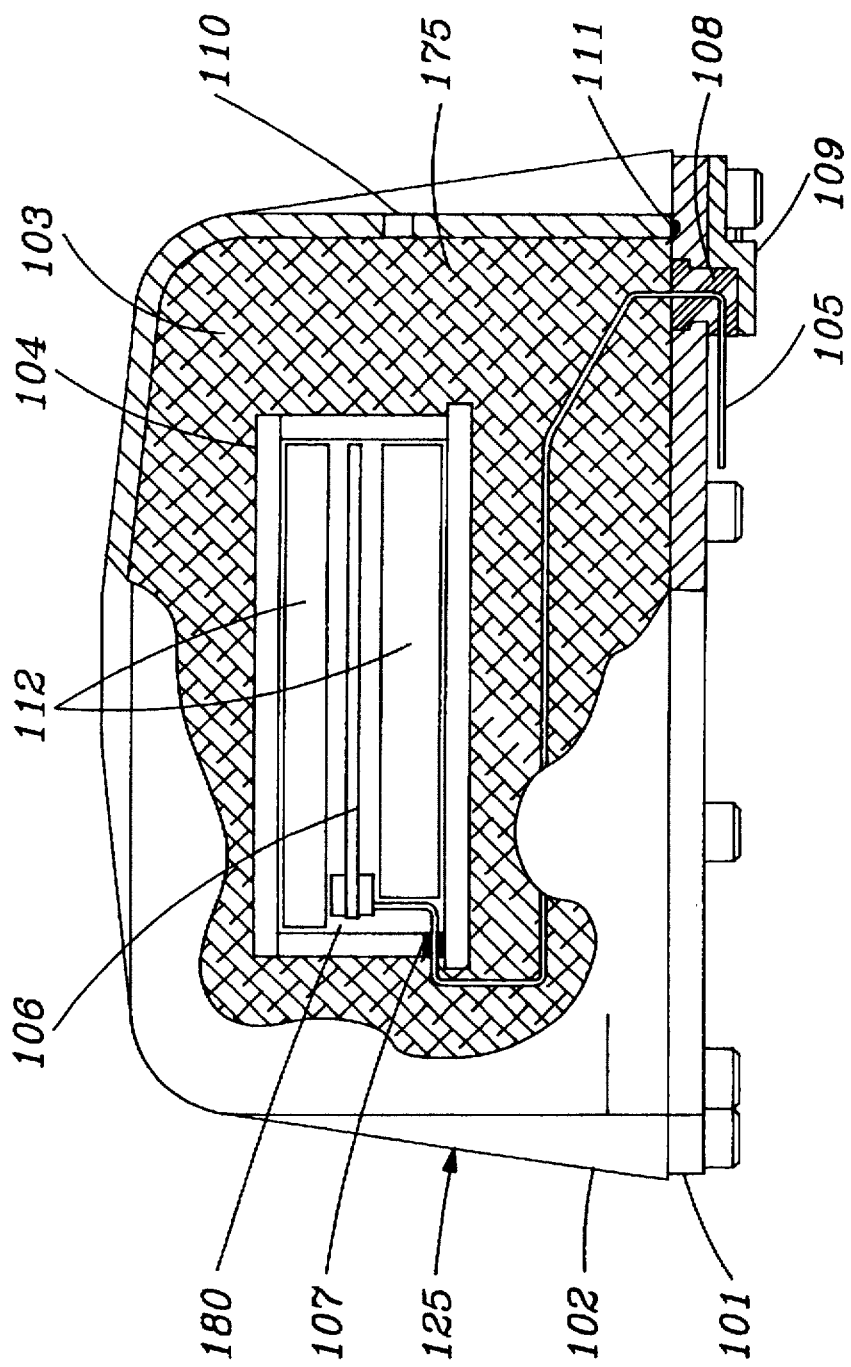
FIG. 1B depicts a partial cross sectional view of the FCSSU depicted in FIG. 1A.
Figure 1C:
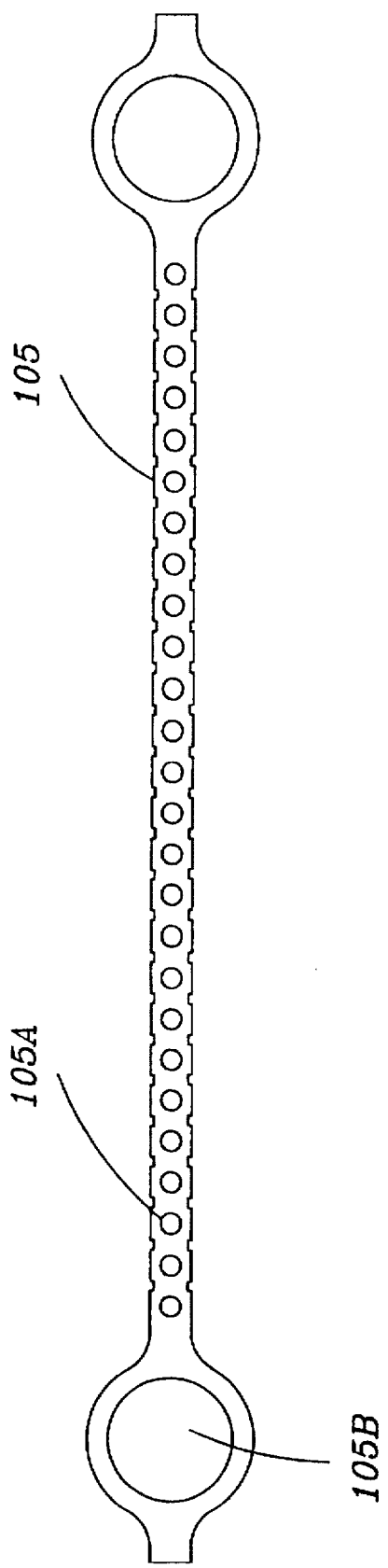
FIG. 1C is a sectional view of cable 105 depicted in FIG. 1B.

As indicated hereinbefore, for the sake of illustration only, the principals of the invention will be described in the context of a FR and FCSSU enclosure located therein, where the FCSSU is constructed in accordance with the teachings of the invention as shown in FIGS. 1A–1C.

Reference should now be made to FIG. 1A and FIG. 1B which both depict illustrative FCSSU 125, with FCSSU 125 being shown installed in FR 100 (in FIG. 1A only). A crash housing cover 101 for FCSSU 125 is depicted in both FIG. 1A and FIG. 1B. An example of a commercially available device which has an FCSSU installed in a FR as shown in FIG. 1A is the aforementioned Model A100AS SSCVR system presently manufactured and sold by Loral Data Systems of Sarasota Fla.

FIG. 1A also depicts, located outside the exterior of crash housing cover 101: (a) a portion of ribbon cable 105; and (b) cable exit protection means 109, the purpose and function of which will also be explained hereinafter with reference to FIG. 1B.

As indicated hereinbefore, FIG. 1B depicts a partial cross sectional view of FCSSU 125. FCSSU 125 is shown in FIG. 1B to be a sealed enclosure when crash housing cover 101 and the depicted crash housing 102 are assembled.

According to alternate embodiments of the invention, crash housing cover 101 and crash housing 102 are comprised essentially of titanium (for lightest weight); or of commercially available 17-4PH stainless steel (for greatest strength); with cover 101 and housing 102 being similar to crash housings and covers currently used on the referenced Model A100AS SSCVR. When cover 101 is affixed to housing 102, an outer housing including an inner cavity 175 is formed (as in the Model A100AS SSCVR), within which a heat sensitive item (like solid state memory 106 of FIG. 1B) may be installed and protected.

As indicated hereinbefore, FIG. 1B also depicts a partial cross sectional view of thermal mass 103. In a preferred embodiment of the invention thermal mass 103 acts as both a thermal mass and a thermal insulator. Suitable materials for realizing thermal mass 103 will be discussed hereinafter.

FIG. 1B also depicts (a) aquarium 104, located within the aforementioned inner cavity 175, including at least one protective compartment (180) within which the at least one heat sensitive item (like memory 106) is located; (b) thermal mass 103, located within the inner cavity, covering at least a portion of the exterior surface of aquarium 104; (c) means for venting any moisture that penetrates the aquarium, and enters the at least one protective compartment included therein, to the ambient air outside the outer housing; and (d) means for venting steam from the inner cavity to the ambient air outside the outer housing.

The illustrative means for venting moisture depicted in the Drawing may be seen with reference to FIGS. 1B and 1C as the vent tube portion of cable 105. An exemplary vent tube is shown specifically as vent tube 105b in FIG. 1C. A normal cable electrical conductor in ribbon cable 105 is shown in FIG. 1C as conductor 105a.

The length of cable 105 is selected as a compromise between heat transfer and an acceptable signal to noise ratio. A long cable reduces the amount of heat transferred to the components contained within aquarium 104; however electronic noise increases. The number and cross section of conductors in the cable should be minimized to reduce heat flow from a fire in towards the devices protected by the aquarium.

The vent tube (whether or not integrated into a device like ribbon cable 105), has, according to a preferred embodiment of the invention, one open end located within protective compartment 180, and the other open end extending into the atmosphere outside of FCSSU 125 and FR 100.

Such a tube would prevent moisture from accumulating in compartment 180, particularly during flight when the moisture would be "sucked out" of the tube due to the negative pressure existing outside the tube opening exposed to the atmosphere.

An exemplary means for venting steam from the inner cavity 175 to the ambient air outside outer housing 102 is depicted in FIG. 1B as thermal vent 110. Thermal vent 110, in outer housing 102 (or alternatively in cover 101), is designed to allow expanded steam to escape without building pressure within cavity 175. Increased pressure in cavity 175 would increase the boiling temperature of thermal mass 103, and could possibly damage aquarium 104.

Thermal vent 110, according to a preferred embodiment of the invention, is designed to stay closed until thermal mass 103 is heated to a predetermined temperature (e.g., 100° C. when water is used as the thermal mass).

Thermal vent 110 may, for example, be realized by one or more thermal vent plugs which are released at a predetermined temperature. Example of suitable materials to use for such plugs are wax, paraffin, bismuth alloy or electrical solder.

FIG. 1B also depicts seal 107, for sealing a cable 105 exit from aquarium 104; seal 108, for sealing a cable 105 exit from FCSSU 125; cable exit protection means 109 (also shown in FIG. 1A as indicated hereinbefore), which is designed to protect the cable 105 exit from FCSSU 125 from being penetrated; seal 111 for the cover 101/housing 102 interface, to prevent moisture transfer across this interface; and padding 112 (shown for the sake of illustration only in two pieces), to protect memory 106 from shock.

Seals 107 and 108 may, for example, be epoxy seals. Padding 112 may, for example, be rubber padding. Cable protection means 109 is preferably made from the same material as cover 101 and housing 102 (e.g., titanium, stainless steel, etc.).

Seal 111 may be realized by an o-ring installed, for example, in a groove at the mating surface between outer housing 102 and cover 101. Such a seal would inhibit moisture transfer.

Aquarium 104 is, according to the teachings of a preferred embodiment of the invention, a sealed unit used to contain a device being protected (such as memory device 106) in at least one protective compartment (180), where the sealed unit is operative to separate thermal mass 103 (e.g., water), located on the exterior of the sealed unit, from the device inside and thereby minimize the transfer of moisture between the thermal mass and the device contained in the at least one protective compartment.

The construction of aquarium 104, according to a preferred embodiment of the invention, is that of a container that is similar to a fish aquarium. A preferred material is clear acrylic which can be chemically welded with a solvent. The clear acrylic allows the welded joints to be visually inspected. A suitable thickness for the aquarium walls, to minimize water transfer, has been found to be 0.125 inches. Those skilled in the art will readily appreciate that other materials for fabricating an "aquarium", and other walled thicknesses may be used, depending on the application intended.

Other aquarium shapes may be designed as well without departing from the spirit or scope of the invention.

The purpose of thermal mass 103 located outside aquarium 104 is to absorb heat and maintain a constant temperature within the aquarium.

Thermal mass 103 preferably is, but does not have to be, a phase change material. According to a preferred embodiment of the invention the thermal mass will operate most efficiently if it utilizes the energy absorption from vaporization to absorb heat. A suitable exemplary PCM meeting this criteria is water.

According to a one embodiment of the invention, the water is contained in a dry material which inhibits the water from freezing or expanding. Such materials include (for example) sponge, silica, polyacrylamide, calcium silicate or pottery clay. Use of a mixture of silica and water in a 65%:35% by weight ratio has been found to be suitable for providing a thermal mass that acts as thermal insulation to provide not only fire protection, but also absorb crash impact energy.

Particularly well suited for use in the FR context is a dry powder thermal mass formed by combining water and silica, or a gel formed by combining water and polyacrylamide. The thermal mass created from such compositions inherently absorb shock which provides additional protection for sensitive component located within aquarium 104.

In operation, the thermal vent plug(s) or other type of seal used, eventually blow out (or melt) when, for example the thermal mass (assumed hereinafter, for the sake of illustration only, to be water), nears its boiling point. According to the illustrative embodiment of the invention (with water as the thermal mass), when thermal vent 110 is opened, steam will escape from outer housing 102 (or cover 101).

Furthermore, according to the illustrative embodiment of the invention, the release of the steam will cause the temperature in protective compartment 180 to remain within a predetermined desirable range thereby allowing the items being protected to continue to operate in a safe manner. However, in order to accomplish this, as indicated hereinbefore, thermal vent 110 must be properly sized.

This may be accomplished by sizing the vent so that steam escapes slowly. The expansion of water when it changes to steam would otherwise create a tremendous pressure which, as indicated hereinbefore, could cause damage to the items contained in protective compartment 180 and damage to the compartment and aquarium structure itself. The boiling point temperature would also rise and might cause thermal damage to the items (e.g.,electronics) contained therein.

Thus it may be seen that, according to a preferred embodiment of the invention, thermal vent 110 is ideally sized to release pressure from protective compartment 180 while maintaining the temperature within protective compartment 180 within a predefined range.

It should also be noted that according to a preferred embodiment of the invention, as shown in FIG. 1B, cable 105 is separated from aquarium 104 by thermal mass 103 which serves as an insulator to reduce heat flow towards aquarium 104.

Finally, the items to be protected within protective compartment 180 may be coated or encapsulated within a variety of materials, well known to those skilled in the art, to provide further protection for against heat, moisture and shock. For example, rubber padding (shown as the previously mentioned padding 112 in FIG. 1B), will provide additional protection for depicted solid state memory 106 against shock damage, the aforementioned coating of chips with a foam (discussed in the context of the referenced Model A100AS SSCVR which employs a low density closed cell foam to encapsulate memory devices), prevents damage due to shock and vibration, etc.

As indicated hereinbefore, it should be noted that a further aspect of the invention is directed to processes for fabricating enclosures (FCSSUs) of the type depicted in FIG. 1B. For the sake of illustration only, without intending to limit the scope of the invention, a description of one such process will be set forth hereinafter.

The first step of the illustrative process is that of providing an electrical connection to at least one heat sensitive item via a cable which will exit the aquarium contained in the FCSSU. The aquarium itself may be fabricated, as indicated hereinbefore, by utilizing clear acrylic to form aquarium walls; chemically welding the clear acrylic with a chemical solvent to inhibit moisture from penetrating the aquarium structure; sealing the cable exit from the aquarium to further prevent moisture transfer; and separating the cable from the aquarium as the cable runs from the aquarium to and through an enclosure containing the thermal mass, etc., to minimize heat transfer between the cable and the aquarium.

As indicated hereinbefore, a preferred process for fabricating an FCSSU contemplated by the invention also includes the step of integrating the means for venting moisture with said cable.

Having described an illustrative process for fabricating a FCSSU of the type depicted in FIG. 1B, those skilled in the art will recognize that many variations are possible without departing from the spirit or scope of the invention.

Finally, a further aspect of the invention is directed to an aquarium per se (for example, aquarium 104 depicted in FIG. 1B), for a protecting a memory device, included in a Flight Recorder (FR), from heat, shock and moisture. The aquarium may be characterized as including a moisture resistant enclosure (104 in FIG. 1B) for containing the device to be protected; means for venting moisture (105b in FIG. 1C) from the enclosure; and a cable (105), for providing electrical connection to the device being protected (e.g., 106), which exits moisture resistant enclosure 104 via a sealed opening (107) in the enclosure.

As indicated hereinbefore, according to a preferred embodiment of the invention, the means for venting moisture is integrated into a ribbon cable.

What has been described in detail hereinabove are methods and apparatus meeting all of the aforestated objectives. As previously indicated, those skilled in the art will recognize that the foregoing description has been presented for the sake of illustration and description only. It is not intended to be exhaustive or to limit the invention to the precise form disclosed, and obviously many modifications and variations are possible in light of the above teaching.

For example, the methods and apparatus described herein were presented in the context of an FCSSU used in FR applications. As indicated hereinbefore, those skilled in the art will readily appreciate that such methods and apparatus are well suited for the protection of other heat sensitive items used in any number of applications.

The embodiments and examples set forth herein were presented in order to best explain the principles of the instant invention and its practical application to thereby enable others skilled in the art to best utilize the instant invention in various embodiments and with various modifications as are suited to the particular use contemplated.

It is, therefore, to be understood that the claims appended hereto are intended to cover all such modifications and variations which fall within the true scope and spirit of the invention.

What is claimed is:

1. A corrosion resistant apparatus for thermally protecting at least one heat sensitive item from high temperatures, shock and moisture utilizing a thermal mass containing a liquid, comprising:

(a) an outer housing including an inner cavity for containing at least one heat sensitive item;

(b) an aquarium located within said inner cavity including at least one protective compartment within which said at least one heat sensitive item is located;

(c) a thermal mass containing a liquid, located within said inner cavity and covering at least a portion of the exterior surface of said aquarium, wherein energy absorption from vaporization of said liquid is utilized to protect said at least one heat sensitive item;

(d) means for venting any moisture, that penetrates said aquarium and enters said at least one protective compartment included therein, to the ambient air outside said outer housing wherein said means for venting directly connects said at least one protective compartment to the ambient air; and (e) means for venting steam from said inner cavity to the ambient air outside said outer housing.

2. Apparatus as set forth in claim 1 wherein said means for venting steam is sized to allow steam to escape from said inner cavity while maintaining pressure and temperature within said inner cavity within a predefined range.

3. Apparatus as set forth in claim 2 further comprising means for sealing said means for venting steam until said thermal mass is heated to a predetermined temperature.

4. Apparatus as set forth in claim 3 wherein said means for sealing further comprises at least one thermal vent plug which is released at said predetermined temperature.

5. Apparatus as set forth in claim 4 wherein said at least one thermal vent plug comprises wax, paraffin, bismuth alloy or electrical solder.

6. Apparatus as set forth in claim 1 further comprising a a cover for said outer housing which when combined with said outer housing forms an enclosure for said inner cavity.

7. Apparatus as set forth in claim 6 further comprising a cable coupled to said at least one heat sensitive item, wherein said cable exits said at least one protective compartment and extends to and through the enclosure formed by the combination of said cover and said outer housing.

8. Apparatus as set forth in claim 7 wherein said cable is isolated from the exterior surface of said aquarium by said thermal mass.

9. Apparatus as set forth in claim 8 wherein said means for venting any moisture further comprises at least one vent tube which exits said at least one protective compartment and extends to and through the enclosure formed by the combination of said cover and said outer housing.

10. Apparatus as set forth in claim 1 wherein said at least one heat sensitive item is coated with a material which protects said item from moisture.

11. Apparatus as set forth in claim 1 wherein said at least one heat sensitive item includes a solid state memory device.

12. Apparatus as set forth in claim 1 wherein said at least one protective compartment includes padding for further protecting s aid at least one heat sensitive item from shock.

13. Apparatus as set forth in claim 6 wherein said means for venting any moisture further comprises a ribbon cable electrically coupled to said at least one heat sensitive item, wherein said ribbon cable exits said at least one protective compartment and extends to and through the enclosure formed by the combination of said cover and said outer housing, and further wherein said ribbon cable has at least one vent tube integrally formed therein for venting moisture.

14. Apparatus as set forth in claim 13 wherein said ribbon cable is isolated from the exterior surface of said aquarium by said thermal mass.

15. Apparatus as set forth in claim 1 wherein said thermal mass is further operative to perform as a thermal insulator.

16. Apparatus as set forth in claim 15 wherein said thermal mass is a mixture of silicon and water.

17. Apparatus as set forth in claim 1 wherein said outer housing is metallic.

18. Apparatus as set forth in claim 1 wherein said outer housing consists essentially of titanium.

19. Apparatus as set forth in claim 1 wherein said outer housing consists essentially of stainless steel.

20. Apparatus as set forth in claim 1 wherein said thermal mass includes a phase change material (PCM).

21. Apparatus as set forth in claim 20 wherein said PCM is water.

22. Apparatus as set forth in claim 21 wherein said water is contained in a dry material which inhibits the water from freezing or expanding.

23. Apparatus as set forth in claim 22 wherein said dry material comprises sponge, silica, polyacrylamide, calcium silicate or pottery clay.

24. Apparatus as set forth in claim 20 wherein said thermal mass is a dry powder formed by combining water and silica.

25. Apparatus as set forth in claim 1 wherein said thermal mass acts as a shock absorber.

26. Apparatus as set forth in claim 25 wherein said thermal mass is a gel formed by combining water and polyacrylamide.

27. A flight recorder apparatus including means for thermally protecting a solid state memory device from high temperatures, shock and moisture utilizing a thermal mass containing a liquid, comprising:

(a) at least one heat sensitive item;

(b) a corrosion resistant Flight Crash Survivable Storage Unit (FCSSU) that contains and protects said at least one memory device from shock, moisture and fire utilizing a thermal mass containing a liquid, wherein said FCSSU comprises:

(b1) an outer housing including an inner cavity for containing at least one heat sensitive item;

(b2) an aquarium located within said inner cavity including at least one protective compartment within which said at least one heat sensitive item is located;

(b3) a thermal mass containing a liquid, located within said inner cavity and covering at least a portion of the exterior surface of said aquarium, wherein energy absorption from vaporization of said liquid is utilized to protect said at least one heat sensitive item;

(b4) means for venting any moisture, that penetrates said aquarium and enters said at least one protective compartment included therein, to the ambient air outside said outer housing wherein said means for venting directly connects said at least one protective compartment to the ambient air; and (b5) means for venting steam from said inner cavity to the ambient air outside said outer housing.

28. Apparatus as set forth in claim 27 wherein said means for venting steam is sized to allow steam to escape from said inner cavity while maintaining the pressure and temperature within said inner cavity within a predefined range.

29. Apparatus as set forth in claim 28 further comprising a means for sealing said means for venting steam until said thermal mass is heated to a predetermined temperature.

30. Apparatus as set forth in claim 29 wherein said means for sealing further comprises at least one thermal vent plug which is released at said predetermined temperature.

31. Apparatus as set forth in claim 30 wherein said at least one thermal vent plug comprises wax, paraffin, bismuth alloy or electrical solder.

32. Apparatus as set forth in claim 27 further comprising a a cover for said outer housing which when combined with said outer housing forms an enclosure for said inner cavity.

33. Apparatus as set forth in claim 32 further comprising a cable coupled to said at least one heat sensitive item, wherein said cable exits said at least one protective compartment and extends to and through the enclosure formed by the combination of said cover and said outer housing.

34. Apparatus as set forth in claim 33 wherein said cable is isolated from the exterior surface of said aquarium by said thermal mass.

35. Apparatus as set forth in claim 34 wherein said means for venting any moisture further comprises at least one vent tube which exits said at least one protective compartment and extends to and through the enclosure formed by the combination of said cover and said outer housing.

36. Apparatus as set forth in claim 27 wherein said at least one heat sensitive item is coated with a material which protects said item from moisture.

37. Apparatus as set forth in claim 27 wherein said at least one heat sensitive item includes a solid state memory device.

38. Apparatus as set forth in claim 27 wherein said at least one protective compartment includes padding for further protecting said at least one heat sensitive item from shock.

39. Apparatus as set forth in claim 32 wherein said means for venting any moisture further comprises a ribbon cable electrically coupled to said at least one heat sensitive item, wherein said ribbon cable exits said at least one protective compartment and extends to and through the enclosure formed by the combination of said cover and said outer housing, and further wherein said ribbon cable has at least one vent tube integrally formed therein for venting moisture.

40. Apparatus as set forth in claim 39 wherein said ribbon cable is isolated from the exterior surface of said aquarium by said thermal mass.

41. Apparatus as set forth in claim 27 wherein said thermal mass further is operative to perform as a thermal insulator.

42. Apparatus as set forth in claim 41 wherein said thermal mass is a mixture of silicon and water.

43. Apparatus as set forth in claim 27 wherein said outer housing is metallic and is further comprised of titanium or stainless steel.

44. Apparatus as set forth in claim 27 wherein said thermal mass includes a phase change material (PCM).

45. Apparatus as set forth in claim 44 wherein said PCM is water.

46. Apparatus as set forth in claim 45 wherein said water is contained in a dry material which inhibits the water from freezing or expanding.

47. Apparatus as set forth in claim 46 wherein said dry material comprises sponge, silica, polyacrylamide, calcium silicate or pottery clay.

48. Apparatus as set forth in claim 44 wherein said thermal mass is a dry powder formed by combining water and silica.

49. Apparatus as set forth in claim 29 wherein said thermal mass acts as a shock absorber.

50. Apparatus as set forth in claim 40 wherein said thermal mass is a gel formed by combining water and polyacrylamide.

51. A process for fabricating a Flight Crash Survivable Storage Unit (FCSSU) for a Flight Recorder (FR) comprising the steps of:
   (a) fabricating an aquarium that includes at least one heat sensitive item, to be protected from heat, moisture and shock, installed in at least one protective compartment;
   (b) installing said aquarium within an outer housing that includes a thermal mass containing a liquid covering at least a portion of the exterior surface of said aquarium;
   (c) fabricating means for venting moisture penetrating said aquarium and entering said at least one protective compartment included therein, to directly connect said at least one protective compartment to the ambient air outside said outer housing;
   (d) covering said outer housing to form a sealed enclosure for said thermal mass, said aquarium and the at least one heat sensitive item contained therein; and
   (e) fabricating a steam vent in said sealed enclosure.

52. A process as set forth in claim 51 further comprising the step of sizing said steam vent to allow steam to escape from within said sealed enclosure while maintaining pressure and temperature therein within a predefined range.

53. A process as set forth in claim 51 wherein said step of fabricating an aquarium further comprising the step of providing an electrical connection to said at least one heat sensitive item via a cable which exits said at least one protective compartment and said aquarium.

54. A process as set forth on claim 53 further comprising the steps of:
   (a) utilizing clear acrylic to form aquarium walls;
   (b) chemically welding said clear acrylic with a chemical solvent;
   (c) sealing a cable exit from said aquarium to prevent moisture transfer; and
   (d) separating said cable from said aquarium to minimize heat transfer therebetween.

55. A process as set forth in claim 54 further comprising the step of coating said at least one heat sensitive item with a material that provides moisture protection.

56. A process as set forth in claim 54 further comprising the step of installing shock protection material in said at least one protective compartment.

57. A process as set forth in claim 54 further comprising the step of integrating said means for venting moisture with said cable.

58. Apparatus for protecting a heat sensitive memory device, included in a Flight Recorder (FR), from heat, shock and moisture utilizing a thermal mass containing a liquid, comprising:
   (a) a moisture resistant enclosure, for containing the memory device to be protected, covered at least in part by the thermal mass containing a liquid;
   (b) an outer housing including an inner cavity for housing said moisture resistant enclosure and said thermal mass containing a liquid;
   (c) means for venting moisture from said enclosure wherein said means for venting directly connects said enclosure to the ambient air; and
   (d) means for venting steam from said inner cavity to the ambient air outside said outer housing.

59. Apparatus as set forth in claim 58 further comprising a cable, for providing electrical connection to said memory device, which exits said moisture resistant enclosure via a sealed opening in said enclosure.

60. Apparatus as set forth in claim 59 wherein said means for venting moisture is integrated into said cable.

* * * * *